United States Patent
Polishchuk et al.

(10) Patent No.: US 7,384,833 B2
(45) Date of Patent: Jun. 10, 2008

(54) STRESS LINER FOR INTEGRATED CIRCUITS

(75) Inventors: Igor Polishchuk, Fremont, CA (US); Krishnaswamy Ramkumar, San Jose, CA (US); Sagy Charel Levy, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 123 days.

(21) Appl. No.: 11/350,160

(22) Filed: Feb. 7, 2006

(65) Prior Publication Data

US 2007/0184597 A1 Aug. 9, 2007

(51) Int. Cl.
*H01L 21/336* (2006.01)
*H01L 21/8234* (2006.01)

(52) U.S. Cl. ............... 438/197; 438/680; 438/692; 257/E21.17; 257/E21.304; 257/E21.229; 257/E21.231; 257/E21.293; 257/E21.632

(58) Field of Classification Search ............... 438/197, 438/199, 207, 663, 692, 700, 680, 740, 753
See application file for complete search history.

(56) References Cited

U.S. PATENT DOCUMENTS

| | | | |
|---|---|---|---|
| 5,683,922 A * | 11/1997 | Jeng et al. | 438/297 |
| 5,798,278 A * | 8/1998 | Chan et al. | 438/300 |
| 5,804,846 A * | 9/1998 | Fuller | 257/252 |
| 6,200,848 B1 * | 3/2001 | Lin et al. | 438/241 |
| 6,350,665 B1 * | 2/2002 | Jin et al. | 438/585 |
| 6,440,791 B1 * | 8/2002 | Gau | 438/239 |
| 6,943,126 B1 * | 9/2005 | Narayanan et al. | 438/784 |
| 2005/0247926 A1 | 11/2005 | Sun et al. | |

OTHER PUBLICATIONS

H.S. Yang, et al., "Dual Stress Liner for High Performance sub-45nm Gate Length SOI CMOS Manufacturing," IEDM Tech. Dig., pp. 1075-1078, Dec. 2004.
PCT International Search Report for PCT/US07/03352 mailed Sep. 24, 2007; total of 2 sheets.

* cited by examiner

*Primary Examiner*—David Nhu
(74) *Attorney, Agent, or Firm*—Okamoto & Benedicto LLP

(57) ABSTRACT

In one embodiment, a self-aligned contact (SAC) trench structure is formed through a dielectric layer to expose an active region of a MOS transistor. The SAC trench structure not only exposes the active region for electrical connection but also removes portions of a stress liner over the active region. This leaves the stress liner mostly on the sidewall and top of the gate of the MOS transistor. Removing portions of the stress liner over the active region substantially removes the lateral component of the strain imparted by the stress liner on the substrate, allowing for improved drive current without substantially degrading a complementary MOS transistor.

12 Claims, 8 Drawing Sheets

STRESS LINER FOR INTEGRATED CIRCUITS

BACKGROUND OF THE INVENTION

1. Field of the Invention

The present invention relates generally to integrated circuits, and more particularly to integrated circuit fabrication processes and structures.

2. Description of the Background Art

Stress liners have been employed to enhance the drive current of transistors in integrated circuits. FIG. 1 schematically shows an example integrated circuit structure 100 for a metal oxide semiconductor (MOS) transistor employing a stress liner 105. In FIG. 1, the structure 100 has a gate 101 formed on a gate oxide 103, which is formed on a substrate 102. Active regions 104 (i.e. source and drain) are formed in the substrate 102. The stress liner 105 comprises silicon nitride deposited under process conditions that result in either tensile or compressive strain, depending on the application. A silicon nitride film under tensile stress is referred to as "tensile nitride" and tends to generate tensile strain in the substrate under the gate, while a silicon nitride film under compressive stress is referred to as "compressive nitride" and tends to generate compressive strain in the substrate under the gate.

A problem with stress liners is that although they may be beneficial for one type of MOS transistor, it may be detrimental to the opposite type. This is particularly troublesome in the manufacture of transistors fabricated using complementary metal oxide semiconductor (CMOS) technology. A CMOS integrated circuit typically has a complementary n-channel MOS (NMOS) transistor and p-channel MOS (PMOS) transistor on the same substrate. Although a tensile nitride film may be beneficial to an NMOS transistor, the same film may degrade a PMOS transistor and vice versa. This is graphically illustrated by the plots shown in FIG. 2, which is discussed in H. S. Yang, et al., "Dual Stress Liner for High Performance sub-45 nm Gate Length SOI CMOS Manufacturing," IEDM Tech. Dig., pp. 1075-1078, December 2004. As shown in FIG. 2, while a tensile nitride film increases the drive current of an NFET, it lowers that of a PFET. Likewise, a compressive nitride film increases the drive current of a PFET but lowers that of an NFET.

SUMMARY

In one embodiment, a self-aligned contact (SAC) trench structure is formed through a dielectric layer to expose an active region of a MOS transistor. The SAC trench structure not only exposes the active region for electrical connection but also removes portions of a stress liner over the active region. This leaves the stress liner mostly on the sidewall and top of the gate of the MOS transistor. Removing portions of the stress liner over the active region substantially removes the lateral component of the strain imparted by the stress liner on the substrate, allowing for improved drive current without substantially degrading a complementary MOS transistor.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of integrated circuit structures, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, well known processing steps, such as masking steps, have been omitted in the interest of clarity.

Figure 1:
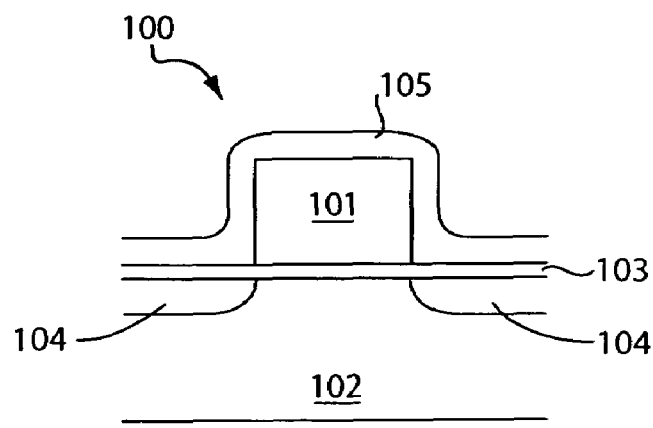
FIG. 1 schematically shows an example integrated circuit structure for a metal oxide semiconductor (MOS) transistor employing a stress liner.
Figure 2:
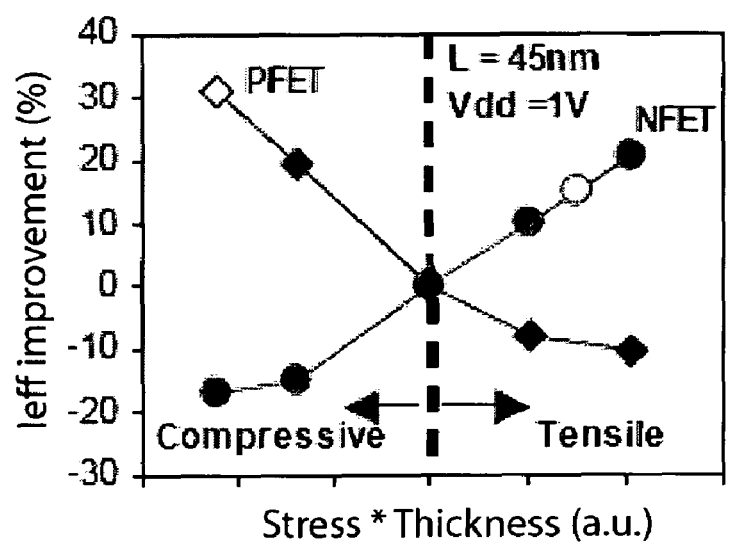
FIG. 2 shows plots illustrating the effect of tensile and compressive strains on MOS transistors.
Figure 3:
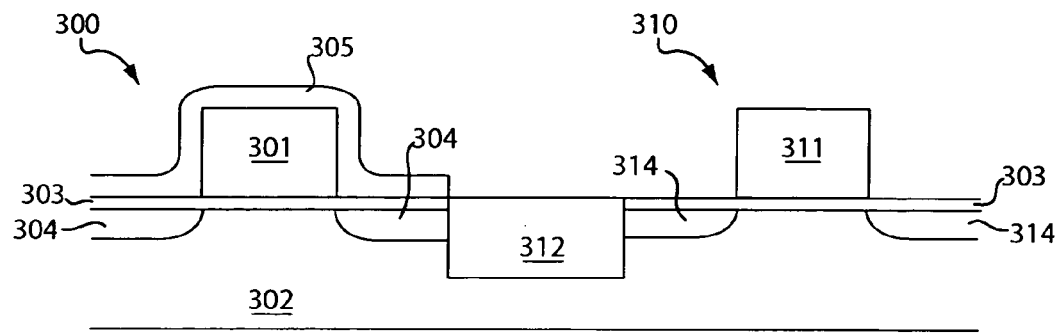
FIG. 3 schematically shows integrated circuit structures, one with a stress liner and one without, formed on a substrate.

One approach to employing stress liners in CMOS integrated circuits is to apply a stress liner in one type of transistors but not the other type. FIG. 3 schematically shows integrated circuit structures 300 and 310 formed on a substrate 302, which may be a semiconductor (e.g. silicon) wafer. Structures 300 and 310 may be separated by an isolation structure 312 (e.g. shallow trench isolation). The structure 300 may be for an NMOS transistor, while the structure 310 may be for a PMOS transistor. In the example of FIG. 3, the structure 300 has a gate 301 formed on a gate oxide 303, which is formed on the substrate 302. Active regions 304 (i.e. source and drain) are formed in the substrate 302. The structure 310 has a gate 311 formed on the gate oxide 303. Active regions 314 are formed in the substrate 302.

A stress liner 305 may comprise a tensile nitride, which may improve the drive current of the NMOS transistor but may degrade that of the PMOS transistor. To prevent degrading the PMOS transistor, the stress liner 305 is formed on the structure 300 but not on the structure 310. In the example of FIG. 3, no stress liner is formed on the structure 310. While workable, this approach requires relatively complicated and costly masking and etching steps and may not be compatible with some preexisting fabrication processes and design rules.

FIGS. 4A-4F schematically show side cross-sectional views of an integrated circuit being fabricated in accordance with an embodiment of the present invention. In the example of FIGS. 4A-4F, only the structure of a single enhancement mode MOS transistor is shown for clarity of illustration. In practice, the MOS transistor is fabricated along with at least a complementary MOS transistor of opposite type. For example, the MOS transistor being fabricated may be an NMOS transistor being fabricated along with its complementary PMOS transistor (or vice versa). The gates, gate oxides, protection liners, spacers, stress liners, and contact structures of both the MOS transistor and its complementary MOS transistor may be formed at the same time. The active regions of the MOS transistor and its complementary MOS transistor may be formed in subsequent steps, with the active regions of the MOS transistor being formed before or after those of the complementary MOS transistor.

Figure 4A:
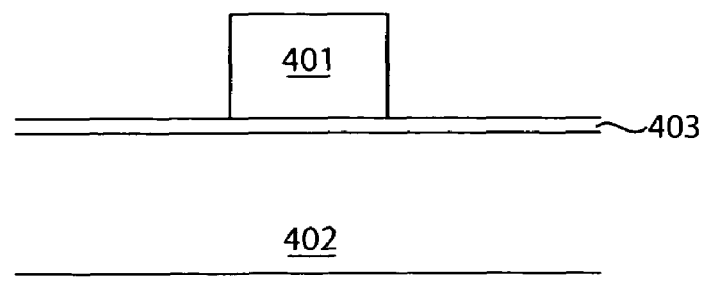
FIGS. 4A-4F schematically show side cross-sectional views of an integrated circuit being fabricated in accordance with an embodiment of the present invention.

In FIG. 4A, a gate 401 of the MOS transistor is formed on a gate oxide 403. The gate oxide 403 may be thermally grown to a thickness of about 15 Angstroms on a substrate 402, which may comprise a semiconductor (e.g., silicon) substrate. The gate 401 may comprise a single material (e.g. polysilicon) or a stack of materials without detracting from the merits of the present invention. For example, the gate 401 may comprise a material stack comprising an 800 Angstroms thick doped polysilicon layer formed on the gate oxide 403, a 50 Angstroms thick barrier layer (e.g. bi-layer of a refractory metal and a refractory nitride) formed on the doped polysilicon layer, a 400 Angstroms thick tungsten layer formed on the barrier layer, and a 1200 Angstroms thick silicon nitride layer formed on the tungsten layer. A similar material stack for a transistor gate is also disclosed in commonly-assigned U.S. Pat. No. 6,869,850, which is incorporated herein by reference in its entirety.

Figure 4B:
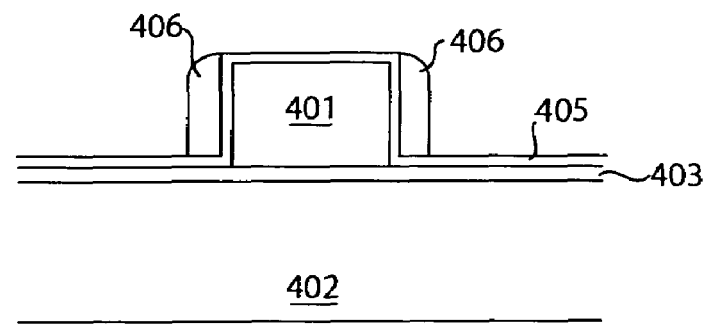

In FIG. 4B, a relatively thin protection liner 405 is formed over the gate 401. The protection liner 405 may comprise silicon nitride deposited to a thickness of about 50-100 Angstroms by low pressure chemical vapor deposition (LPCVD). Disposable spacers 406 are formed on the sidewalls of the gate 401 on the protection liner 405. Each spacer 406 may comprise amorphous silicon formed to a width of about 300 Angstroms. Spacers 406 may be formed by depositing amorphous silicon over the gate 401 by LPCVD followed by blanket etching of the amorphous silicon to form the spacers 406.

Figure 4C:
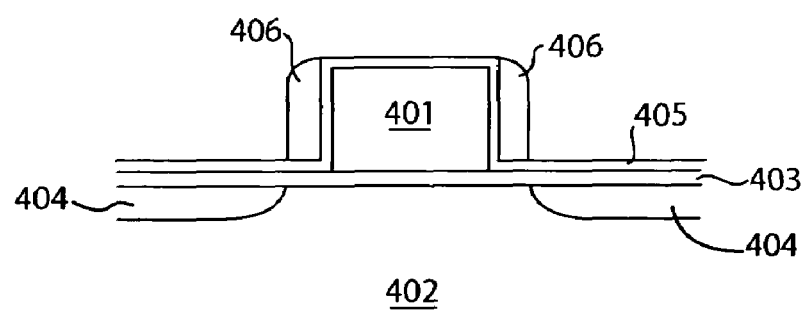

In FIG. 4C, active regions 404 (i.e. source and drain) are formed in the substrate 402. The active regions 404 may be formed by implantation using the spacers 406 for alignment. The implantation step is followed by an activation step, such as a rapid thermal anneal (RTP) step, to activate the dopants implanted in the active regions 404. The spacers 406 are "disposable" in that they are removed after the formation of active regions 404.

Figure 4D:
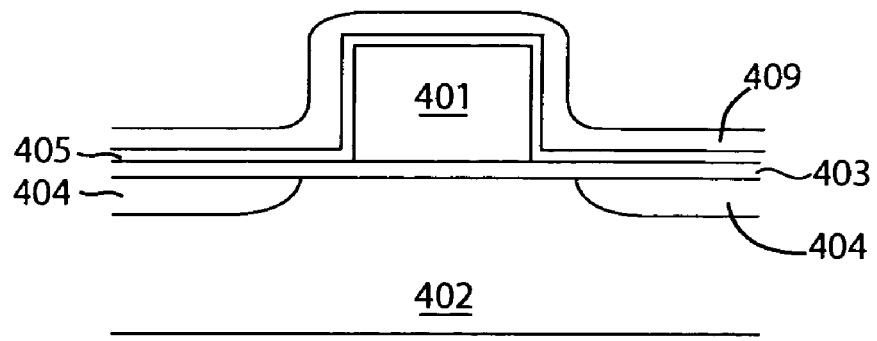

In FIG. 4D, a stress liner 409 is formed over the gate 401 and the active regions 404 after the disposable spacers 406 are removed. The stress liner 409 may be formed such that it imparts stress on an underlying region in the substrate 402 (e.g. channel region between active regions 404) for enhanced carrier mobility and drive current. The stress liner 409 may comprise a tensile nitride to provide tensile strain or a compressive nitride to provide compressive strain. In one embodiment, the stress liner 409 comprises a tensile nitride to enhance the drive current of NMOS transistors in the integrated circuit. As will be more apparent below, although the same tensile nitride film is also formed on PMOS transistors in the same integrated circuit, the detrimental effects of the tensile nitride on the PMOS transistors are minimized by removing the lateral strain components of the tensile nitride. In one embodiment, a tensile stress liner 409 comprises silicon nitride deposited to a thickness of about 200 to 700 Angstroms by low pressure chemical vapor deposition (LPCVD) using BTBAS as a precursor at a temperature of about 550 to 600° C. and a pressure of about 100 mTorr. A suitable LPCVD tool for forming a tensile stress liner 409 includes those from Aviza Technology, Inc.

In other embodiments, the stress liner 409 comprises a compressive nitride to enhance the drive current of PMOS transistors without substantially degrading NMOS transistors in the same integrated circuit. A compressive stress liner 409 may be formed by PECVD in which silane is reacted with ammonia at a temperature of about 350 to 450° C., pressure of about 1-5 Torr, high frequency RF power of about 700 watts, and low frequency RF power of about 100 watts using a PECVD tool from Novellus Systems, Inc., for example.

Other processes and tools may also be used to form a stress liner 409 without detracting from the merits of the present invention.

Figure 4E:
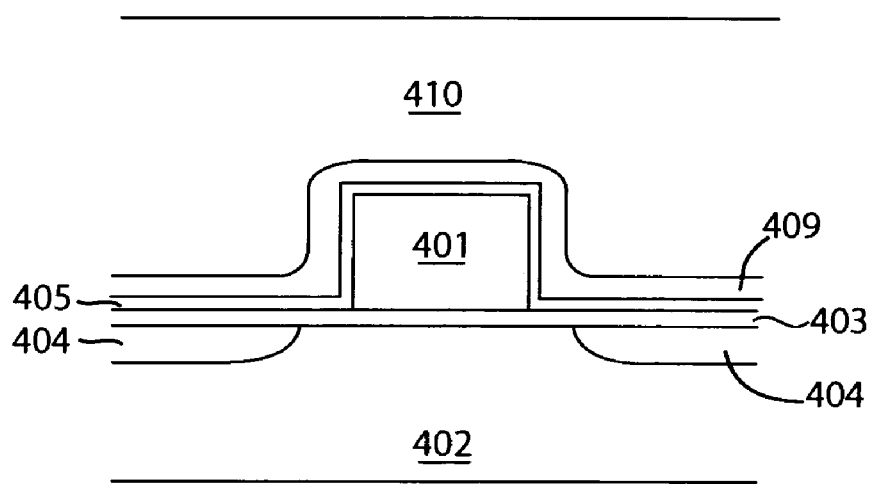

In FIG. 4E, a layer of dielectric 410 is formed over the sample of FIG. 4D. In one embodiment, the dielectric 410 comprises phosphorus-doped silicon dioxide (PSG) deposited to a thickness of about 8000 Angstrom by high-density plasma chemical vapor deposition (HDP CVD). The dielectric 410 may be planarized to a thickness of about 3000 Angstrom by chemical-mechanical polishing (CMP).

Figure 4F:
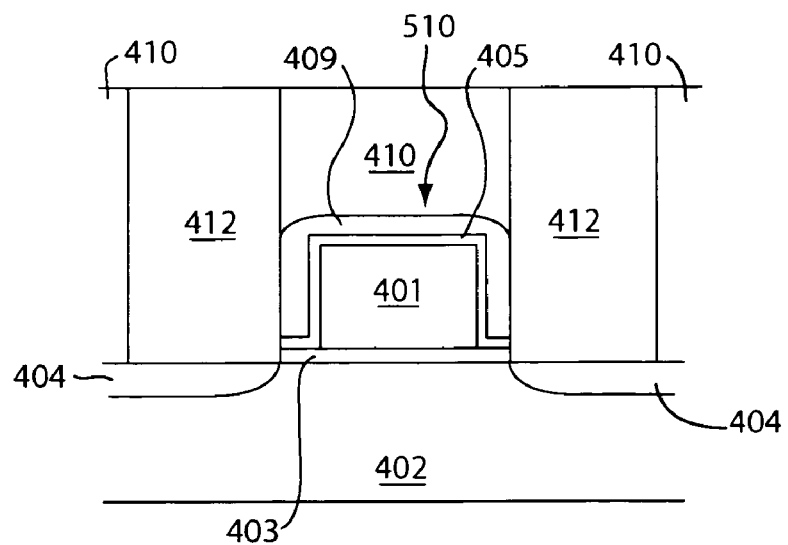

In FIG. 4F, self-aligned contact (SAC) trench structures 412 are formed through the dielectric 410. The SAC trench structures 412 expose the active regions 404 to allow electrical connection thereto. In a subsequent step (not shown), a metal may be deposited in the SAC trench structures 412 to make an electrical connection to the active regions 404. The SAC trench structures 412 are self-aligned in that they are formed through the dielectric 410 using an etch process that is selective to the stress liner 405. That is, the etch process used to form the SAC trench structures 412 does not appreciably etch the stress liner 409, thereby making the alignment of the mask for the etch process less critical. This advantageously allows the SAC trench structures 412 to be placed closer to the gate structure 510, formed by the stress liner 409, the protective liner 405, and the gate 401. Note that the protective liner 405 serves primarily as an etch stop for the removal of the disposable spacers 406. The protective liner 405 may thus be left in place or removed after removal of the disposable spacers 406 without detracting from the merits of the present invention.

In one embodiment, the SAC trench structures 412 are formed through the dielectric 410 using a two-step etch process. The first etch step may comprise an oxide etch with high selectivity to nitride using a $C_4F_6$ based plasma, for example. The second etch step may involve the use of $CH_3F$ based plasma to remove nitride from source/drain regions. Preferably, the second etch step has a high degree of anisotropy to preserve the stress liner 409 on the sidewalls of the gate 401.

Figure 5:
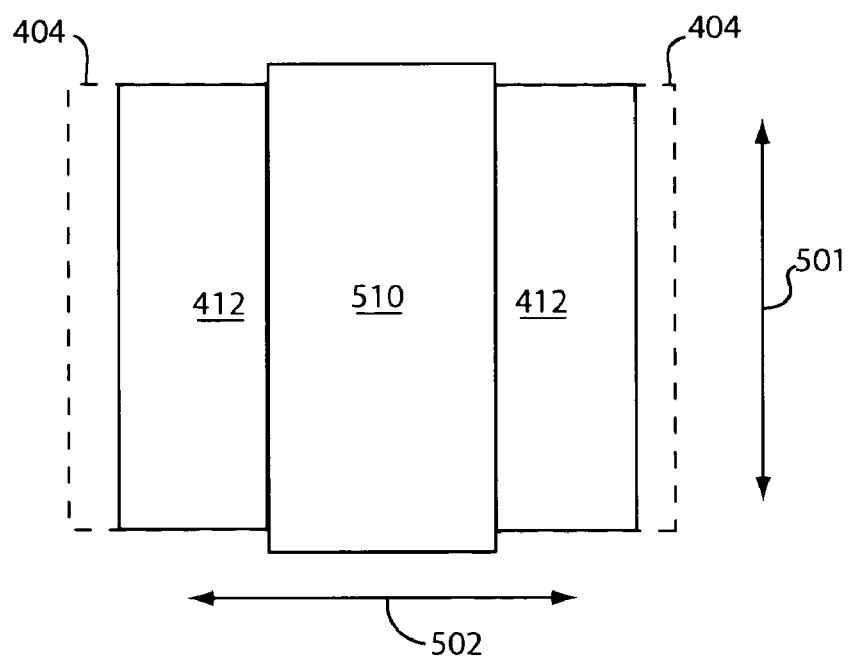
FIG. 5 schematically shows a top view of contact trench structures in relation to a gate structure and active regions in accordance with an embodiment of the present invention.

The SAC trench structures 412 are trenches in that they are formed by digging a single trench structure along a width of the transistor. In the example of FIG. 4F, the trench structures 412 expose the active regions 404 using a single trench, rather than a plurality of relatively small square contact structures found in conventional transistors. FIG. 5 schematically shows a top view of the trench structures 412 in relation to the gate structure 510 and the active regions 404. An arrow 501 is along the width of the transistor, while an arrow 502 is along the length of the transistor. Note the single trench structure 412 over each active region 404.

The SAC trench structures 412 substantially remove most of the stress liner 409 along the entire width of the transistor. This results in most of the stress liner 409 covering the top and sidewalls of the gate 401 but not the active regions 404. That is, while there may be portions of the stress liner 409 remaining over the active regions 404 depending on the alignment of the etching of the SAC trench structures 412, the etching of the SAC trench structures 412 substantially removes the lateral portions of the stress liner 409 over the active regions 404. The lateral portions of the stress liner 409 may degrade the performance of the MOS transistor or its complementary MOS transistor, and are thus advantageously removed.

The SAC trench structures 412 may be filled with metal in subsequent processing steps (not shown) completing the MOS transistor and its complementary MOS transistor.

Figure 6A:
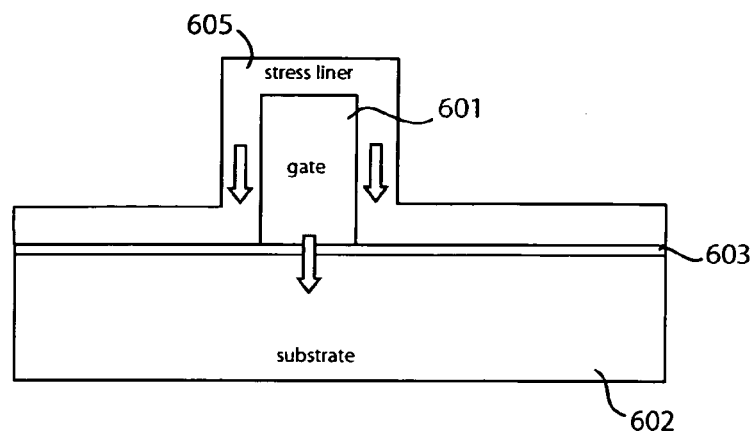
FIGS. 6A-6C schematically illustrate the mechanism the inventors believe allow for the benefits provided by stress liners in accordance with embodiments of the present invention.
Figure 6B:
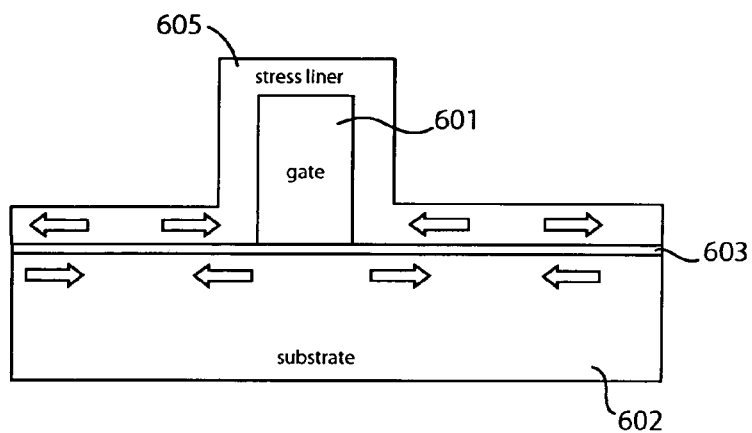
Figure 6C:
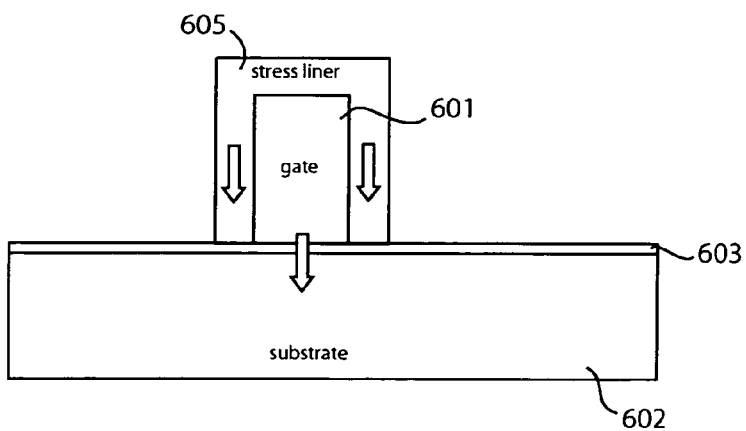

FIGS. 6A-6C schematically illustrate the mechanism the inventors believe allow for the benefits provided by stress liners in accordance with embodiments of the present invention. FIG. 6A shows a cross-sectional view of an integrated circuit structure for a MOS transistor. FIG. 6A shows the width of the MOS transistor; the active regions are not shown for clarity of illustration. The MOS transistor includes a gate 601 formed over a gate oxide 603, which is over a substrate 602. A stress liner 605 is formed over the gate 601 and the substrate 602. The arrows of FIG. 6A represent the vertical component of the strain imparted by the stress liner 605 on the channel region. As can be appreciated, the channel region is in the substrate 602 under the gate 601 between the active regions. The vertical component of the strain helps improve the drive current of the MOS transistor while minimally enhancing (or degrading) the drive current of its complementary MOS transistor.

In FIG. 6B, the arrows represent the lateral component of the strain imparted by the stress liner 605 on the substrate 602. The lateral component of the strain enhances the drive current of the MOS transistor but substantially degrades the drive current of its complementary MOS transistor.

In FIG. 6C, the lateral component of the strain is removed by removing portions of the stress liner 605 over the active regions. Portions of the stress liner 605 over the sidewall and top of the gate 601 and diffusion regions not adjacent to the channel region may remain. This allows for improved drive current in one MOS transistor due to the vertical component of the strain, without substantially affecting the drive current of its complementary MOS transistor. This advantageously allows for using the same stress liner on both the NMOS and PMOS transistors, simplifying the fabrication process and improving drive current of one of the transistors without adversely affecting the other. Using a trench structure to expose the active regions advantageously removes the lateral component of the strain and exposes the active regions in the same process step.

Figure 7A:
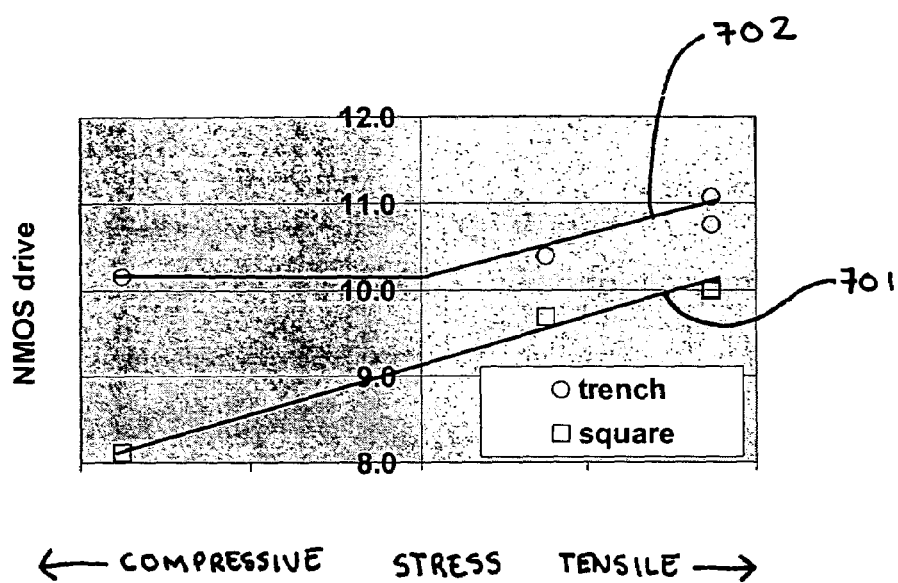
FIGS. 7A and 7B show plots comparing measured drive currents of enhancement mode MOS transistors with stress liners.
Figure 7B:
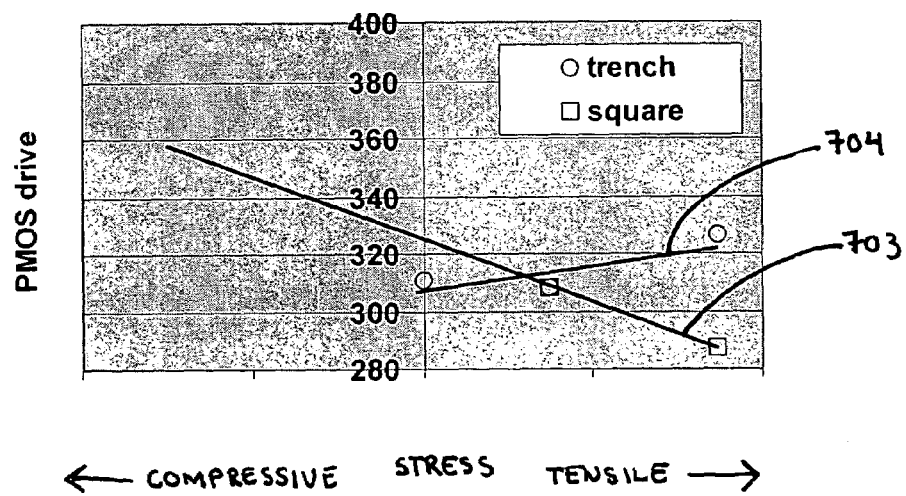

FIGS. 7A and 7B show plots comparing measured drive currents of enhancement mode MOS transistors with stress liners. In FIGS. 7A and 7B, the vertical axis represents drive current, while the horizontal axis represents stress. The 0 position on the horizontal axis represents no strain. To the right of the 0 position represents increasing tensile strain and to the left represents increasing compressive strain.

In FIG. 7A, plot 701 is for an NMOS transistor with stress liner and a plurality of relatively small square contact structures over each active region. Plot 702 is for an NMOS transistor with stress liner and a single contact trench structure over each active region. Plot 702 shows that a contact trench structure (which removes lateral components of the strain) increases the drive current of the NMOS transistor when using a tensile stress liner (e.g. tensile nitride) and provides more drive current compared to the square contact structures even when using a compressive stress liner.

In FIG. 7B, plot 703 is for a PMOS transistor with stress liner and a plurality of relatively small square contact structures over each active region. Plot 704 is for a PMOS transistor with stress liner and a single contact trench structure over each active region. Plot 704 shows that a contact trench structure has minimal effect on the drive current of the PMOS transistor when using a tensile stress liner. Plot 703, on the other hand, shows that square contact structures result in decreased drive current as more tensile strain is applied on the substrate.

Figure 8:
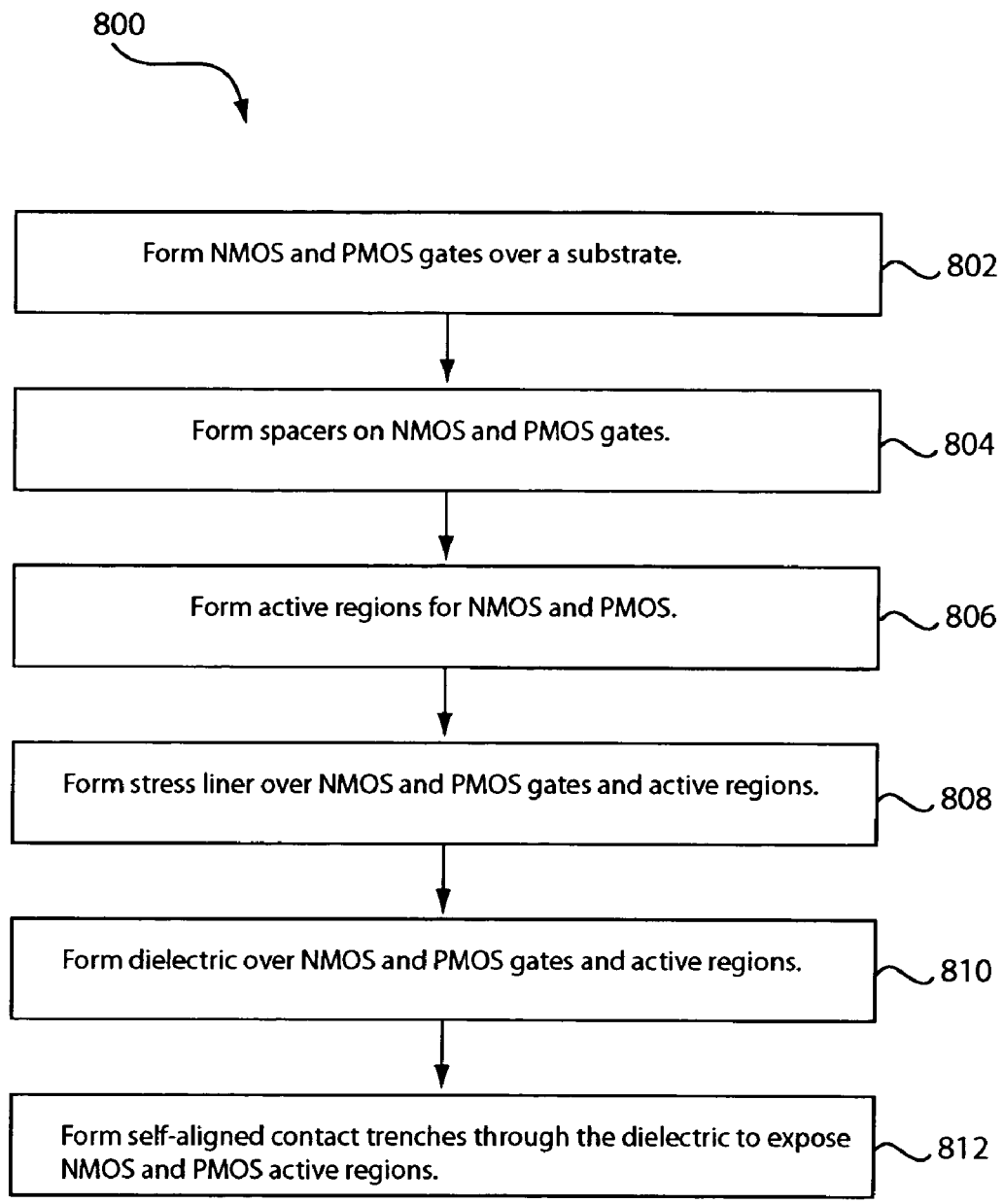
FIG. 8 shows a flow diagram of a method of forming an integrated circuit structure in accordance with an embodiment of the present invention.

Referring now to FIG. 8, there is shown a flow diagram of a method 800 of forming an integrated circuit structure in accordance with an embodiment of the present invention. In one embodiment, the integrated circuit is fabricated using CMOS technology and has at least a pair of complementary (i.e. an NMOS and a PMOS) enhancement mode MOS transistors.

In step 802, the gates of an NMOS transistor and a PMOS transistor are formed over the same substrate. The gates may be formed on a gate oxide, which is on the substrate comprising silicon.

In step 804, spacers are formed on the sidewalls of the gates of the NMOS and PMOS transistors. The spacers are used to align an implantation step for forming active regions (i.e. source and drain). In one embodiment, the spacers comprise disposable spacers that are removed after formation of the active regions. Non-disposable spacers may also be used in integrated circuits where the widths of the spacers do not violate design requirements given the added bulk of the subsequently formed stress liner.

In step 806, the active regions of the NMOS and PMOS transistors are formed. Step 806 may be performed by implantation using the spacers for alignment. The active regions of the NMOS and PMOS transistors may be performed one after the other. For example, the active regions of the NMOS transistor may be formed by implanting n-type dopants using an implant mask. Thereafter, the first implant mask is removed and the active regions of the PMOS transistor is formed by implanting p-type dopants using a second implant mask. The active regions of the NMOS and PMOS transistors may be activated using an RTP process. The RTP process may be formed before or after a stress liner (see step 808) depending on the particulars of the process. If the spacers formed in step 804 are disposable, they may be removed after the formation of the active regions of the NMOS and PMOS transistors.

In step 808, a layer of stress liner is formed over the NMOS and PMOS gates and active regions. The same layer of stress liner may be used for both the NMOS and PMOS transistors. The stress liner may comprise a tensile stress liner or a compressive stress liner depending on whether the NMOS or PMOS transistor is being optimized. For example, the stress liner may comprise a tensile stress liner to enhance the drive current of the NMOS transistor. Similarly, the stress liner may comprise a compressive stress liner to enhance the drive current of the PMOS transistor.

In step 810, a layer of dielectric is formed over the NMOS and PMOS gates and active regions. The dielectric may be planarized by CMP.

In step 812, self-aligned contact trench structures are formed through the dielectric layer and intervening layers. The contact trench structures are self-aligned to allow the trench structures to be formed relatively close to their respective gates. In one embodiment, the contact trench structures are self-aligned in that the stress liner serves as an etch stop protecting under layers (e.g. gates) during the etching of the dielectric layer to form the contact trench structures. The contact trench structures not only expose the active regions for electrical connection but also remove substantial portions of the stress liner overlying the active regions. This advantageously allows for the benefits of the stress liner for one type of MOS transistor without degrading the complementary MOS transistor. The contact trench structures may be formed such that a single trench (instead of a plurality of small contact structures) is dug over each active region.

Figure 9:
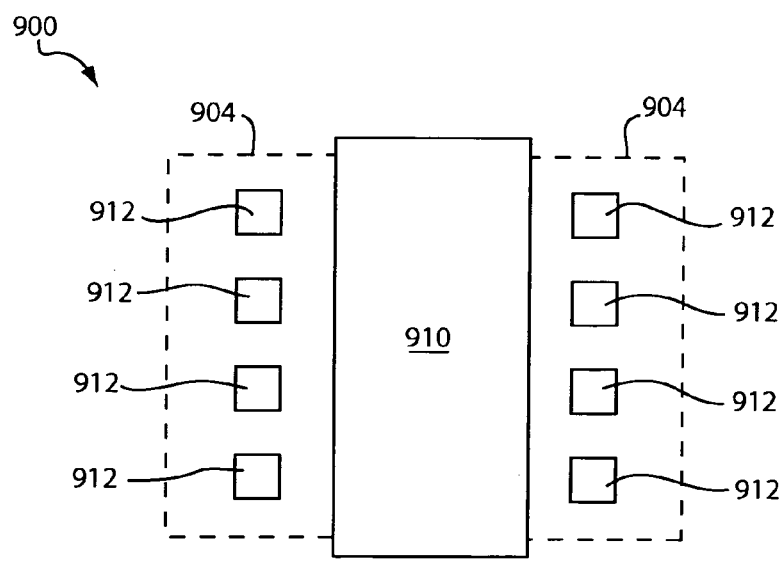
FIG. 9 schematically shows a top view of an integrated circuit structure employing a plurality of relatively small contact structures to expose each active region.

FIG. 9 schematically shows a top view of an integrated circuit structure 900 employing a plurality of relatively small contact structures 912 to expose each active region 904. A gate structure 910 is formed between the active regions 904. In the example of FIG. 9, the contact structures 912 are square but may also have other shapes. As previously discussed, a contact trench structure may be employed in conjunction with a stress liner to improve the drive current of a MOS transistor without appreciably degrading the drive current of its complementary MOS transistor. Similar benefits may be obtained by forming contact trench structures in a MOS transistor and a plurality of small contact structures in the complementary MOS transistor. For example, an integrated circuit having the same stress liner film on both an NMOS transistor and a PMOS transistor may have a single contact trench structure on each active region of the NMOS transistor and a plurality of small contact structures on each active region of the PMOS transistor. Likewise, a single contact trench structure may be formed on each active region of the PMOS transistor and a plurality of small contact structures may be formed on each active region of the NMOS transistor.

In another aspect of the present invention, the drive current of MOS transistors is enhanced by orienting the channels of the MOS transistors along the <011>or <001> wafer orientation as determined from the notch on the wafer. The drive current of MOS transistors may also be improved by forming the transistors on substrates having alternative surface orientation. In both of these approaches, different channel orientations and surface orientations may be tested to find the one that provides the best improvement in drive current. Both of these approaches may be employed in conjunction with the above described stress liners. For example, an NMOS and a PMOS transistor with stress liners and SAC trench structures may be formed on a substrate such that their channels are oriented along the <011>or <001> wafer orientation. As another example, an NMOS and a PMOS transistor with stress liners and SAC trench structures may be formed on a substrate that has a (100) surface orientation or (110) surface orientation.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of forming an integrated circuit structure, the method comprising:
    forming a gate of a first MOS transistor over a substrate;
    forming active regions of the first MOS transistor in the substrate;
    forming a stress liner over the gate and active regions of the first MOS transistor, the stress liner imparting strain on the substrate to increase a drive current of the first MOS transistor;
    forming a dielectric layer over the gate and the active regions of the first MOS transistor; and
    forming a trench structure over each of the active regions of the first MOS transistor through the dielectric layer such that each of the active regions of the first MOS transistor is exposed for an electrical connection and portions of the stress liner over each of the active regions of the first MOS transistor are removed.

2. The method of claim 1 further comprising:
    forming a gate of a second MOS transistor over the substrate, the first and second MOS transistors being complementary MOS transistors;
    forming active regions of the second MOS transistor in the substrate, wherein the stress liner formed over the gate and active regions of the first MOS transistor is also formed over the gate and active regions of the second MOS transistor; and
    forming a trench structure over each of the active regions of the second MOS transistor through the dielectric layer such that each of the active regions of the second MOS transistor is exposed for an electrical connection and portions of the stress liner over each of the active regions of the second MOS transistor are removed.

3. The method of claim 1 wherein forming the active regions of the first MOS transistor comprises:
    forming disposable spacers on sidewalls of the gate of the first MOS transistor;
    implanting dopants in the substrate using the disposable spacers for alignment; and
    removing the disposable spacers before the stress liner is formed over the gate and active regions of the first MOS transistor.

4. The method of claim 1 wherein the first MOS transistor comprises an NMOS transistor and wherein the stress liner imparts tensile strain on the substrate.

5. The method of claim 1 wherein the first MOS transistor comprises a PMOS transistor and wherein the stress liner imparts compressive strain on the substrate.

6. The method of claim 1 wherein the stress liner comprises silicon nitride.

7. The method of claim 1 wherein the stress liner comprises a material that is not appreciably etched by an etchant used to etch the dielectric layer to form a trench structure over each of the active regions of the first MOS transistor.

8. The method of claim 2 wherein the first MOS transistor comprises an NMOS transistor and the second MOS transistor comprises a PMOS transistor.

9. A method of forming an integrated circuit structure, the method comprising:
    forming a gate of a first MOS transistor and a second MOS transistor, the first and second MOS transistors being a complementary pair of MOS transistors;
    forming spacers on sidewalls of the gates of the first and second MOS transistors;
    forming active regions of the first and second MOS transistors using the spacers for alignment;
    removing the spacers from the sidewalls of the gates of the first and second MOS transistors;
    forming a same stress liner over the gates and active regions of the first and second MOS transistors, the stress liner imparting strain on the substrate;
    forming a dielectric layer over the gates and active regions of the first and second MOS transistors; and
    forming a self-aligned contact (SAC) trench structure over each of the active regions of the first and second MOS transistors through the dielectric layer, the SAC trench structure removing substantial portions of the stress liner over an underlying active region and exposing the underlying active region.

10. The method of claim 9 wherein the stress liner imparts tensile strain on the substrate.

11. The method of claim 9 wherein the stress liner imparts compressive strain on the substrate.

12. The method of claim 9 wherein forming the SAC trench structure comprises:

etching the dielectric layer using an etchant that does not appreciably etch the stress liner.

* * * * *